United States Patent
Coolbaugh et al.

(10) Patent No.: US 7,129,561 B2
(45) Date of Patent: Oct. 31, 2006

(54) TRI-METAL AND DUAL-METAL STACKED INDUCTORS

(75) Inventors: Douglas D. Coolbaugh, Essex Junction, VT (US); Daniel C. Edelstein, White Plains, NY (US); Robert A. Groves, Highland, NY (US); Zhong-Xiang He, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/707,065

(22) Filed: Nov. 19, 2003

(65) Prior Publication Data

US 2005/0104157 A1   May 19, 2005

(51) Int. Cl.
  *H01L 29/00*   (2006.01)
  *H01F 5/00*   (2006.01)
(52) U.S. Cl. .......... 257/531; 257/528; 336/200
(58) Field of Classification Search ........ 257/531, 257/528; 336/200; 438/381–385
See application file for complete search history.

(56) References Cited

U.S. PATENT DOCUMENTS

| | | | |
|---|---|---|---|
| 5,446,311 A | 8/1995 | Ewen et al. | |
| 5,656,849 A | 8/1997 | Burghartz et al. | |
| 6,124,624 A | 9/2000 | Van Roosmalen et al. | |
| 6,287,931 B1 * | 9/2001 | Chen | 438/381 |
| 6,287,932 B1 | 9/2001 | Forbes et al. | |
| 6,395,637 B1 * | 5/2002 | Park et al. | 438/706 |
| 6,639,298 B1 * | 10/2003 | Chaudhry et al. | 257/531 |
| 2001/0025153 A1 | 9/2001 | Farrar et al. | |
| 2002/0011653 A1 | 1/2002 | Ferrari et al. | |
| 2002/0017699 A1 | 2/2002 | Shenoy | |
| 2002/0101322 A1 | 8/2002 | Liu et al. | |
| 2002/0125575 A1 * | 9/2002 | Chaen | 257/758 |

* cited by examiner

*Primary Examiner*—Douglas W. Owens
*Assistant Examiner*—Samuel Gebremariam
(74) *Attorney, Agent, or Firm*—Scully, Scott, Murphy & Presser, P.C.; William D. Sabo, Esq.

(57) ABSTRACT

A high performance inductor which has a relatively low sheet resistance that can be integrated within a semiconductor interconnect structure and can be used in RF applications, including RF CMOS and SiGe technologies, is provided. The inductor is either a dual-metal inductor including a first layer of metal which serves as an upper metal wire in the semiconductor structure and a second layer of metal located directly on top of the first layer of metal, or a tri metal inductor, which includes a third layer of metal located directly on top of the second layer of metal. No vias are located between the various metal layers of the inventive inductor.

19 Claims, 4 Drawing Sheets

TRI-METAL AND DUAL-METAL STACKED INDUCTORS

BACKGROUND OF INVENTION

1. Field of the Invention

The present invention relates to integrated circuits (ICs), and more particularly to an IC including a high performance metal stacked inductor that is integrated into a semiconductor interconnect structure

2. Background of the Invention

In the semiconductor industry, digital and analog circuits, including complex microprocessors and operational amplifiers, have been successfully implemented in silicon-based integrated circuits (ICs). Such Si-based ICs typically include active devices such as, for example, bipolar transistors and field effect transistors (FETs), diodes, and passive devices, including resistors, capacitors, and inductors.

Attempts to miniaturize radio frequency (RF) circuits, however, remain a challenge. RF circuits are generally employed in cellular phones, wireless modems, PDAs, and other types of communication equipment. The miniaturization problem is a result of the difficulty in producing a good inductor in silicon technologies which is suitable for RF applications at widely used microwave frequencies from 900 MHz to 2.4 GHz.

Monolithic microwave integrated circuits (MMICs), which are rapidly outpacing discrete ICs in mobile wireless communication products, require high-Q (quality factor) passive components, such as inductors and capacitors, to be able to realize integrated filters and matching sections with small insertion losses.

If conventional silicon technology is used, e.g., BiCMOS, the inductor is clearly the performance and density limiting passive element. While the quality factor Q of an integrated inductor can be improved by modifying the interconnect technology by switching from AlCu to Cu or Au interconnects, the area consumption of the inductor structure is difficult to reduce.

It is well known that the direct current (DC) resistance of a metal line that forms a spiral inductor is a major contributor to the inductor Q degradation. One way to reduce this effect is to use wide metal line widths. However, such an approach increases the inductor area and the parasitic capacitance associated with the structure. Wider metal line widths within a spiral inductor are also subject to frequency dependent loss mechanisms related to eddy current generation within the metal lines (typically called "proximity effect"). Wider and more closely spaced spiral lines will be subject to increased proximity effect over narrower, more widely spaced lines.

The large inductor area limits the miniaturization that can be achieved. The combined negative contributions of parasitic capacitance associated with the large area (lower self resonance frequency), and proximity effects from wide metal lines (increasing frequency dependent loss) further limit the useful frequency range.

A standard feature in present day very large scale integration (VLSI) is the use of multi-level interconnects for inductor integration. Using this technology, some have shunted several layers of metal together to "simulate" a thicker metal layer than achievable in AlCu interconnect technology. See, for example, U.S. Pat. No. 5,446,311 to Ewen, et al. Shunted inductors represent an improvement over the previous prior art.

A typical prior art dual-metal inductor of the type described in the Ewen, et al. disclosure is shown, for example, in FIG. 1. Specifically, FIG. 1 shows a prior art dualmetal inductor 10 that comprises a top metal wire inductor 16 in the MA level that is connected by via 14 to a bottom metal wire inductor 12. The bottom metal wire inductor 12 is connected by another via 14" to a termination metal level 11. The dual-metal inductor 10 is located in an interlevel or intralevel dielectric (not specifically labeled) of an interconnect structure.

In the prior art dual-metal inductor 10 shown in FIG. 1, the top metal wire inductor 16 is typically an Al wire having a thickness of about 4 μm, and the bottom metal wire inductor 12 is typically a Cu wire having a thickness of about 3 μm. Vias 14, 14" typically have a much smaller width than the metal wire inductors and they are typically comprised of W.

The dual-metal inductor shown in FIG. 1 is used in the industry to provide high performance in both series and parallel inductors for very high Q applications (peak Q of 28, 1 nH inductor, 3–4 GHz) and is driven by the sheet resistance of the metal wire inductors. Series inductance densities of 3–4× single devices are being achieved.

One major problem with the metal stacked inductor shown in FIG. 1 is that the inductor has a sheet resistance that is too high for use in many RF applications. The high sheet resistance of the prior art dual-metal stack inductor is caused by the presence of the W via that is used in interconnecting the top metal wire inductor to the bottom metal wire inductor. The resistance of the W via is much higher than that of metal wires.

Despite the above, there is a continued need for providing integrated metal stacked inductors that have a high quality factor Q (on the order of about 25 or above), yet have a substantially low sheet resistance (on the order of about 5 mOhms/square or less). Such integrated metal stacked inductors would be highly useful in RF applications, in particularly RF complementary metal oxide semiconductor (CMOS) and SiGe technologies.

SUMMARY OF INVENTION

The present invention provides a high performance metal stacked inductor which has a relatively low sheet resistance that can be integrated within a semiconductor interconnect structure and can be used in RF applications, including RF CMOS and SiGe technologies. The term "high performance" is used in the present application to denote a metal stacked inductor that has a high Q factor that is on the order of about 25 or above, a low inductance that is on the order of about 1 nH or less, and a metal sheet resistance of less than about 5 mOhms/square. The terms "relatively low sheet resistance" or "substantially low sheet resistance" are used in the present invention to describe a metal stacked inductor having a sheet resistance of about 5 mOhms/square or less, preferably 4 mOhms/square or less, and even more preferably 3 mOhms/square or less.

Specifically, and in broad terms, the present invention provides a semiconductor structure which comprises a high performance metal stacked inductor having a relatively low sheet resistance, said metal stacked inductor comprising a first layer of metal which serves as an upper metal wire in the semiconductor structure and a second layer of metal located directly on top of the first layer of metal.

The inductor including the metal stack of the first layer of metal and the second layer of metal is a dual-metal inductor. A portion of the inventive dual-metal inductor (i.e., the first layer of metal) is embedded in one or more interlevel or intralevel dielectrics of a semiconductor interconnect structure. The substantially low sheet resistance of the dual-metal inductor of the present invention is achieved since no via is used in interconnecting the first layer of metal to the second layer of metal.

In another embodiment of the present invention, a third layer of metal is located directly on top of the second layer of metal. In this embodiment of the present invention, a tri-metal inductor is provided. A portion of the inventive tri-metal inductor (e.g., the first and second layers of metal) is embedded in one or more interlevel or intralevel dielectrics of a semiconductor interconnect structure. The substantially low sheet resistance of the tri-metal inductor of the present invention is achieved since no vias are located between any of the first, second and third layers of metal.

The first layer of metal, the second layer of metal and, when present the third layer of metal, of the inventive inductors are composed of the same or different low resistivity conductive material. The term "low resistivity" when used in connection with the various metal layers of the inventive inductor denotes a conductive material whose resistivity is about 3 micro-ohms*cmor less. Illustrative examples of low resistivity conductive materials include, but are not limited to: Cu, Al, Pt, Ag, Au, and alloys thereof. In one embodiment of the present invention, the first layer of metal is comprised of Cu and the second layer of metal is comprised of Al. In yet another embodiment of the present invention, the first and second layers of metal are comprised of Cu and the third layer of metal is comprised of Al.

Another aspect of the present invention relates to a method of fabricating the semiconductor structures of the present invention. Specifically, the method of the present invention comprises the steps of:

providing a partial interconnect structure comprising a lower metal wiring level located on a substrate;

forming at least a first dielectric material on the partial interconnect structure;

forming a first layer of metal in said first dielectric material, said first layer of metal serves as an upper metal wire of the interconnect structure and as the bottom layer of a metal stacked inductor; and forming a second layer of metal on said first dielectric material, said second layer of metal is in direct contact with the first layer of metal.

In an embodiment of the present invention, a third layer of metal is formed directly on top of the second layer of metal. In this embodiment, the second layer of metal is formed in a second patterned dielectric material that is located atop the first patterned and filled dielectric material.

DETAILED DESCRIPTION

Figure 1:
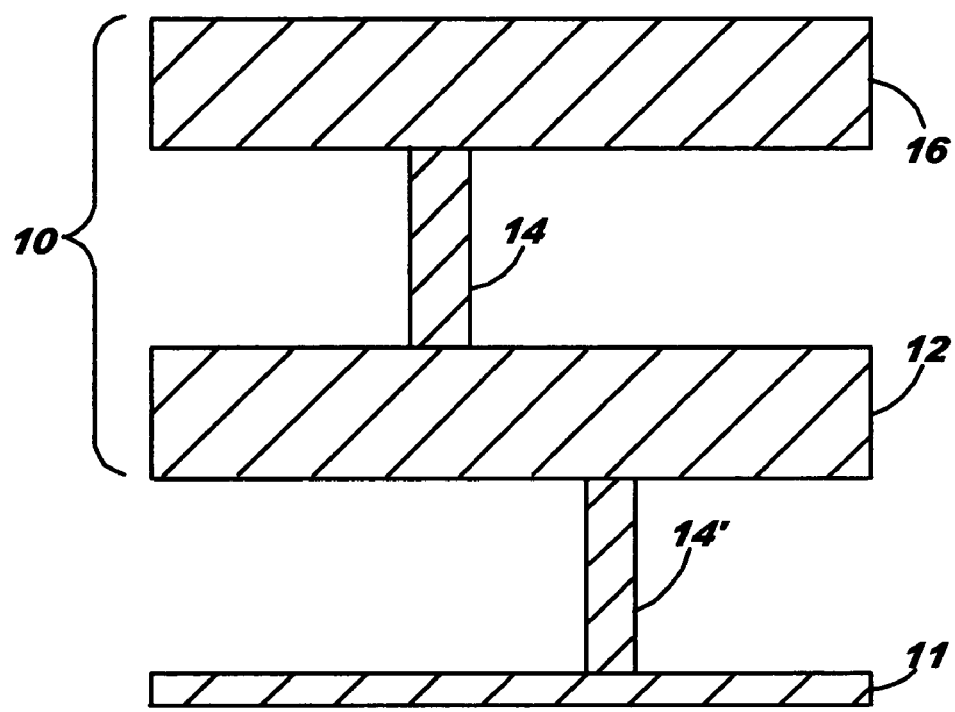
FIG. 1 is a pictorial representation (through a cross sectional view) showing a prior art metal stacked inductor.

The present invention, which provides high performance metal stacked inductors that are integrated within a semiconductor interconnect structure as well as a method of fabricating the same, will now be described in greater detail by referring to the drawings that accompany the present application. It is noted that the various elements depicted in the drawings are not drawn to scale. Moreover, the drawings of the present invention show only the inductor area of the structure. Other areas, such as wiring areas can lay to the periphery of the inductor area shown.

Figure 2:
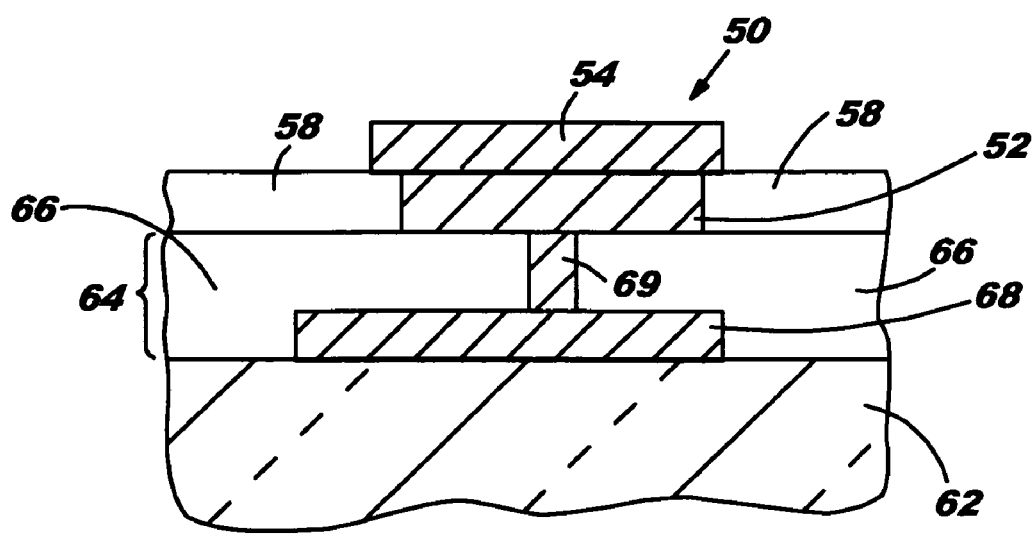
FIG. 2 is a simple pictorial representation (through a cross sectional view) showing one metal stacked inductor of the present invention, in particular a dual-metal stacked inductor is shown.
Figure 3:
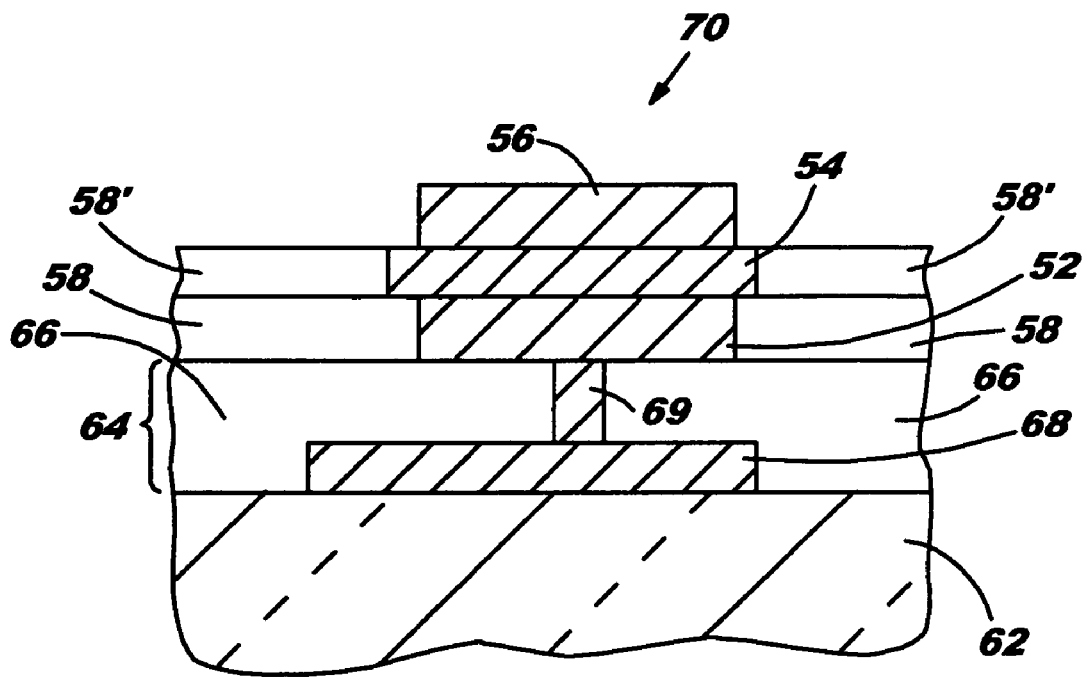
FIG. 3 is a simple pictorial representation (through a cross sectional view) showing another metal stacked inductor of the present invention, in particular a tri-metal stacked inductor is shown.

As stated above, the present invention provides high performance metal stacked inductors that have a substantially low sheet resistance. The metal stacked inductors of the present invention are shown in FIGS. 2 and 3 of the present application; FIGS. 4A–4E show the basic process flow for fabricating the dual-metal stacked inductors of the present invention. A similar process flow would be used in forming the tri-metal inductor. Specifically, in the tri-metal inductor processing, the structure shown in FIG. 4C is first provided. The processing steps shown in FIGS. 4B–4C are repeated to form a patterned second dielectric layer atop the first dielectric material and thereafter the processing steps shown, for example, in FIGS. 4D–4E are performed.

Specifically, and in reference to FIG. 2, there is shown a dual-metal inductor 50 of the present invention. The dual-metal inductor 50 of the present invention comprises a first layer of metal 52 and a second layer of metal 54 that is located directly on top of the first layer of metal. Unlike the prior art dual-metal inductor shown in FIG. 1, the dual-metal inductor of the present invention does not include any high resistivity metal via between the first layer of metal 52 and the second layer of metal 54.

The first layer of metal 52 of the dual-metal inductor 50 of the present invention is formed within a first dielectric material 58 that is formed on top of a partial interconnect structure that includes substrate 62 and a lower metal wiring level 64. The lower metal wiring level 64 comprises a dielectric 66 that includes a lower metal wire 68 embedded therein. It is noted that in the inventive structure, the first layer of metal 52 not only serves as the bottom metal layer of the dual-metal inductor 50, but it also serves as the upper metal wire of the interconnect structure. As shown, the lower metal wiring level 64 is in electrical contact with the first layer of metal 52 of the dual-metal inductor 50 by via 69.

The second layer of metal 54 is located directly on top of the first layer of metal 52. In some embodiments, portions of the second layer of metal 54 extend onto the first dielectric material 58.

FIG. 3 illustrates a tri-metal inductor 70 of the present invention. Specifically, the tri-metal inductor 70 of the present invention comprises a first layer of metal 52, a second layer of metal 54 that is located directly on top of the first layer of metal 52 and a third layer of metal 56 that is located directly on top of the second layer of metal 54. Similar to the dual-metal inductor configuration, the tri-metal inductor 70 of the present invention does not include any high resistivity metal via between the first layer of metal 52, the second layer of metal 54 and the third layer of metal 56.

The first layer of metal 52 of the tri-metal inductor 70 of the present invention is formed within a first dielectric material 58, the second layer of metal 54 is located within a second dielectric material 58" that is formed on top of the first dielectric material 58, and the third layer of metal 56 is located directly atop the second layer of metal 54. In some embodiments, portions of the third layer of metal 56 may extend on the surface of the second dielectric material 58". The first and second dielectric materials may be selected from the same or different dielectric materials.

As shown, the first dielectric material 58 of the tri-metal inductor 70 is located on a partial interconnect structure that includes substrate 62 and a lower metal wiring level 64. The lower metal wiring level 64 includes dielectric 66 and metal wiring 68. It is noted that in the inventive structure, the first layer of metal 52 not only serves as the bottom metal layer of the tri-metal inductor 70, but it also serves as the upper metal wiring level of the interconnect structure. As shown, the lower metal wiring level 64 is in electrical contact with the upper metal wiring level, i.e. the first layer of metal 52 of the tri-metal inductor 70 by via 69.

The dual-metal inductor 50 and the tri-metal inductor 70 may be formed into any conventional shape that is well known to those skilled in the art. Thus, for example, the dual-metal inductor 50 and the tri-metal inductor 70 may be spiral shaped, rectangular shaped, square shaped, octagon shaped and the like. In a preferred embodiment of the present invention, the dual- and tri-metal inductors of the present invention are spiral shaped inductors.

The various materials and processing steps employed in fabricating the structures shown in FIGS. 2 and 3 will now be described in greater detail by referring to the discussion that follows hereinbelow together with the cross sections shown in FIGS. 4A–4E. It is again emphasized that for the tri-metal inductor of the present invention the structure shown in FIG. 4C is first provided. The processing steps shown in FIGS. 4B–4C are repeated to form a patterned second dielectric layer that includes the second layer of metal atop the first dielectric material and thereafter the processing steps shown, for example, in FIGS. 4D–4E are performed to form the third layer of metal directly on top of the second layer of metal.

Figure 4A:
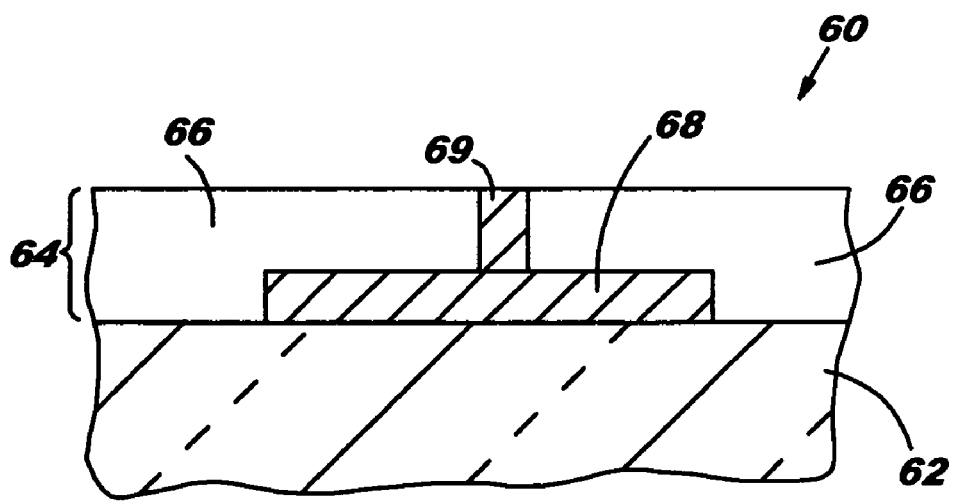
FIGS. 4A–4E are pictorial representations (through cross sectional views) showing the basic processing steps used in forming the dual-metal stacked inductor of the present invention.
Figure 4B:
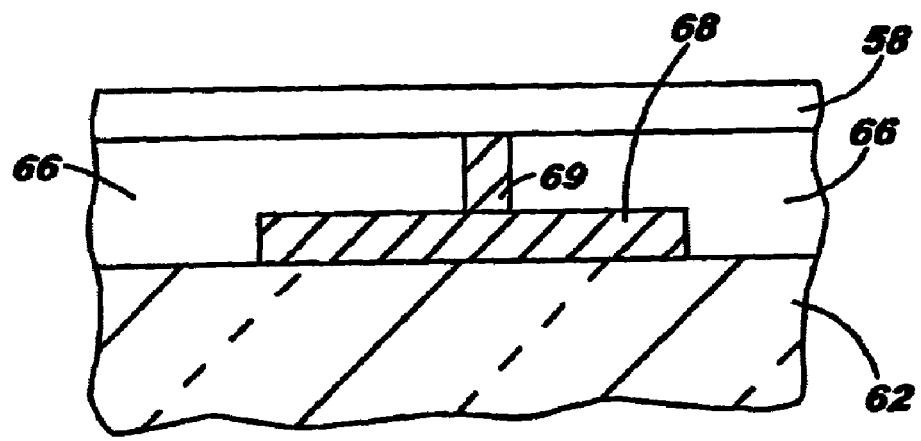
Figure 4C:
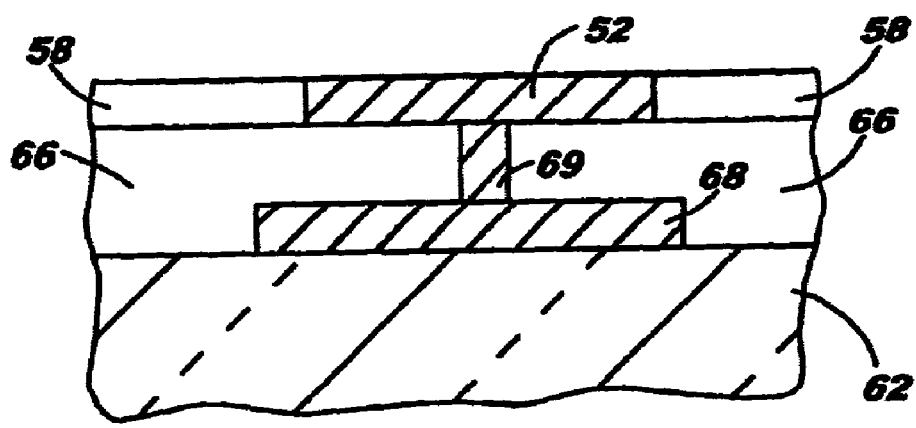
Figure 4D:
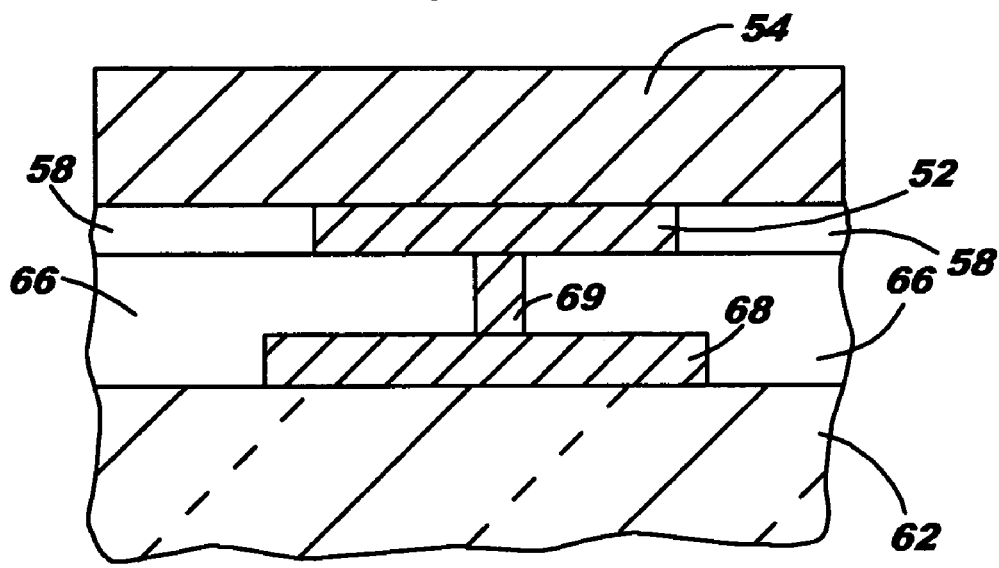
Figure 4E:
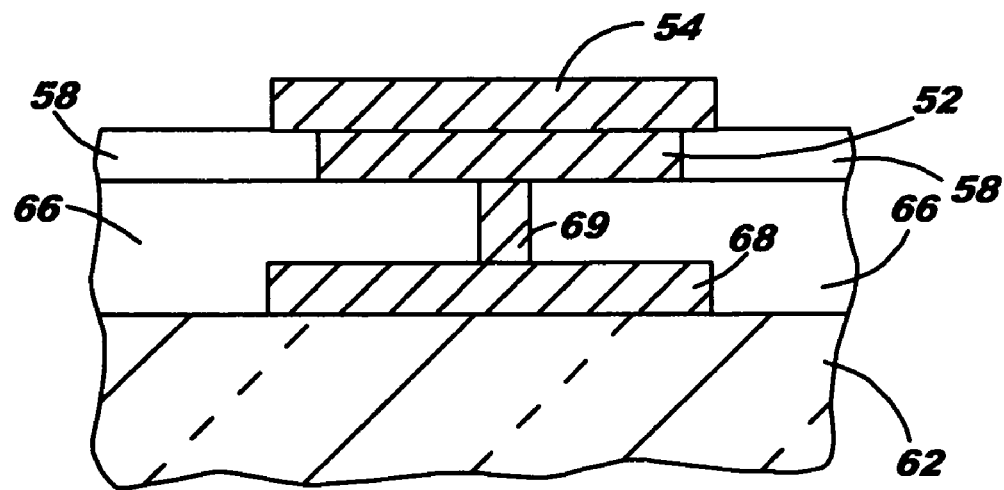

Specifically, FIG. 4A shows an initial interconnect structure 60 that can be employed in the present invention. The initial interconnect structure 60 comprises a substrate 62 that has a metal wiring level 64 located on a surface thereof. The substrate 62 of the initial interconnect structure 60 may comprise any semiconducting material, insulator or a stack thereof, e.g., a stack of semiconductor material and an insulator.

The term "semiconducting material" is used in the present invention to denote a wafer or substrate that is comprised of a semiconductor such as Si, SiGe, SiGeC, SiC, GaAs, InAs, InP, other III/V compound semiconductors, silicon-on-insulators (SOIs), and silicon germanium-on-insulators (SGOIs). The semiconducting material may contain various devices such as CMOS transistors, capacitors, bipolar transistors, resistors, or any combination thereof. These devices are located within or on a surface of the semiconducting material. The various devices are typically separated from each other by isolation regions that are also present in the semiconducting material.

When the substrate 62 is comprised of an insulator, the insulator includes any inorganic or organic dielectric material. The insulator can be porous or non-porous and may have a low dielectric constant (less than 4.0) or a high dielectric constant (4.0 or greater). Illustrative examples of insulators that can be used as substrate 62 include, but are not limited to: oxides such as $SiO_2$, $Al_2O_3$, $HfO_2$, $ZrO_2$, and perovskite oxides, nitrides, oxynitrides, polyimides, polyimines, Si-containing polymers, or low-k dielectric constant materials such as SILK.

The metal wiring level 64 of the initial interconnect structure 60 comprises a conductive wiring region 68 embedded within an interconnect dielectric 66. The conductive wiring region 68 includes various conductive materials such as, for example, Cu, Al, W, TiN and alloys thereof. The interconnect dielectric 66 is comprised of one of the various insulators mentioned above.

The metal wiring level 64 can be formed on top of the substrate 62 at this point of the present invention by first depositing a layer of a conductive material on top of the substrate 62 and then patterning the deposited conductive layer into the metal wiring region 68.

The conductive layer can be deposited using a conventional deposition process including, for example, chemical vapor deposition, (CVD), plasma-assisted chemical vapor deposition, physical vapor deposition (PVD), sputtering, plating, chemical solution deposition, atomic layer deposition, and other like deposition processes. The conductive layer may have a varying thickness after deposition, but typically the conductive layer has a thickness after deposition of about 50 to about 1500 nm.

After deposition of the conductive layer, the conductive layer is patterned by lithography and etching. The lithography step includes forming a photoresist on top of the conductive layer by utilizing a conventional deposition process such as, for example, spin-on coating, evaporation, chemical vapor deposition, plasma-assisted chemical vapor deposition and the like. After photoresist application, the photoresist is exposed to a pattern of radiation and then the pattern is developed in the exposed photoresist utilizing a conventional resist developer. The patterned photoresist protects portions of the conductive layer, while leaving other portions exposed. The exposed portions of the conductive layer are then removed by an etching process such as reactive ion plasma etching, wet chemical etching, laser ablation, or ion beam etching to provide the conductive wiring region 68. Conductive wiring region 68 is the lowermost wiring level of the interconnect structure.

Interconnect dielectric 66 is then deposited by a conventional deposition process such as, for example, spin-on coating, CVD, plasma-assisted CVD, evaporation or other like deposition process. The thickness of interconnect dielectric 66 after deposition may vary and is not critical to the present invention.

Next, the interconnect dielectric 66 is patterned by lithography and etching to provide a via opening that exposes an upper surface portion of the metal wiring region 68. The via opening is then filled with a conductive material such as W, Al, Cu and the like by a conventional deposition process such as one of the deposition processes mentioned above in connection with the conductive layer. The conductively filled via is labeled as region 69 in the drawings. If needed, the entire structure can be planarized at this point of the present invention by utilizing a conventional planarization process such as chemical mechanical polishing or grinding.

After providing the partial interconnect structure shown in FIG. 4A, a first dielectric material 58 is formed on top of the initial structure providing the structure shown in FIG. 4B. The first dielectric material 58 (hereinafter first dielectric 58) can be composed of a single dielectric material or it can be comprised of a plurality of dielectric materials. The first dielectric 58 can be composed of the same or different insulator as interconnect dielectric 66. If different dielectrics are used, an adhesive promoter such as an alkoxysilane may be applied to the surface of interconnect dielectric 66 prior to deposition of the first dielectric 58. A hardmask and/or an etch stop layer may also be formed on top of the interconnect dielectric 66 prior to deposition of the first dielectric 58.

The first dielectric 58 is then patterned by lithography to form a first opening for the first layer of metal 52 and after removing the patterned photoresist, the first layer of metal 52 is deposited and planarized utilizing a conventional technique, such as chemical mechanical polishing (CMP) or grinding, such that the first layer of metal 52 fills the first opening. As shown, an upper surface of the first layer of metal 52 is substantially co-planar with the upper surface of the first dielectric 58. The resulting structure is shown in FIG. 4C. The first layer of metal 52 may be deposited utilizing any of the deposition processes previously mentioned above in connection with the conductive layer. As shown, the first layer of metal 52 is in contact with the lower metal wiring region 68 by via 69.

The first layer of metal 52 is composed of a low resistivity conductive material. The term "low resistivity" has the same meaning as provided in the Summary Section of this application. Illustrative examples of low resistivity conductive materials include, but are not limited to: Cu, Al, Pt, Ag, Au, and alloys thereof. In one embodiment of the present invention, the first layer of metal 52 is comprised of Cu.

The thickness of the first layer of metal 52 after deposition and planarization may vary, but typically the first layer of metal 52 has a thickness from about 0.5 to about 4.0 µm. In one preferred embodiment of the present invention, the first layer of metal 52 is comprised of Cu that has a thickness from about 3 to about 4 µm.

It is noted that after forming the at least one opening and prior to filling the at least one opening with the first layer of metal, the patterned resist is removed from the first dielectric 58.

After the filling and planarization step, a second layer of metal 54 is formed atop the entire structure including the first layer of metal 52 and the first dielectric 58 providing the structure shown, for example, in FIG. 4D. The second layer of metal 54 may be deposited utilizing any of the deposition processes previously mentioned above in connection with the conductive layer. The second layer of metal 54 is composed of a low resistivity conductive material, which may be the same or different from the low resistivity conductive material of the first layer of metal 52. Illustrative examples of low resistivity conductive materials include, but are not limited to: Cu, Al, Pt, Ag, Au, and alloys thereof.

In one embodiment of the present invention, and when a dual-metal inductor is to be formed, the second layer of metal 54 is comprised of Al. In another embodiment of the present invention, and when a tri-metal inductor is to be formed, the second layer of metal 54 is comprised of Cu.

The thickness of the second layer of metal 54 may vary depending on whether a dual-metal inductor or a tri-metal inductor is to be formed. In the case of the dual-metal inductor, the thickness of the second layer of metal 54 is typically from about 0.5 to about 4.0 µm. In one preferred embodiment of the present invention in which a dual-metal inductor is formed, the second layer of metal 54 is comprised of Al that has a thickness from about 3 to about 4 µm. In another preferred embodiment of the present invention in which a tri-metal inductor is formed, the second layer of metal 54 is comprised of Cu that has a thickness from about 3 to about 4 µm.

After forming the second layer of metal 54, the second layer of metal 54 is typically patterned by lithography and etching which results in the structure illustrated in FIG. 4E. The etching step includes an etchant that selectively removes the exposed portions of the second layer of metal 54. The edges of the second layer of metal 54 may extend onto the first dielectric 58, as shown, or they may be located with the area of the first layer of metal 52.

A similar process flow would be used in forming the tri-metal inductor. Specifically, in the process flow for forming the tri-metal inductor of the present invention, the structure shown in FIG. 4C is first provided. The processing steps shown in FIGS. 4B–4C are repeated to form a patterned second dielectric layer 58" that includes the second layer of metal 54 atop the first dielectric material 58 and thereafter the processing steps shown, for example, in FIGS. 4D–4E are performed to form the third layer of metal 56 directly on top of the second layer of metal 54. The second dielectric 58' may be composed of the same or different dielectric as layer 58. When different dielectrics are employed, an adhesion promoter may be utilized.

It should be noted that in other areas of the interconnect structure such as, for example, in the wiring areas, the second layer of metal 54 serves as a via interconnecting two metal wires; the two metal wires are composed of the first layer of metal 52 and the third layer of metal 56.

The third layer of metal 56 may be deposited utilizing any of the deposition processes previously mentioned above in connection with the conductive layer. Following deposition of the third layer of metal 56, the third layer of metal 56 is patterned by lithography and etching to provide the structure shown in FIG. 3. The third layer of metal 56 is composed of a low resistivity conductive material, which may be the same or different from the low resistivity conductive material of the first and second layers of metal. Illustrative examples of low resistivity conductive materials include, but are not limited to: Cu, Al, Pt, Ag, Au, and alloys thereof. In one embodiment of the present invention, the third layer of metal 56 is comprised of Al.

The thickness of the third layer of metal 56 may vary, but typically, the thickness of the third layer of metal is typically from about 0.5 to about 4.0 µm. In one preferred embodiment, the third layer of metal 56 is comprised of Al and it has a thickness of from about 3 to about 4 µm.

While the present invention has been particularly shown and described with respect to preferred embodiments thereof, it will be understood by those skilled in the art that the foregoing and other changes in forms and details may be made without departing from the scope and spirit of the present invention. It is therefore intended that the present invention not be limited to the exact forms and details described and illustrated, but fall within the scope of the appended claims.

The invention claimed is:

1. A semiconductor structure comprising a high performance metal stacked inductor having a relatively low sheet resistance, said metal stacked inductor comprising at least one first layer of metal embedded within a dielectric material, said first layer of metal serving as an upper metal wire in the semiconductor structure and a second layer of metal located directly on top of the first layer of metal and above said dielectric material, wherein said first layer of metal is in electrical contact with a lower metal wire by a via, and said first layer of metal and said second layer of metal are not interconnected by a via.

2. The semiconductor structure of claim 1 further comprising a third metal layer located directly on top of the second layer of metal, wherein said second layer of metal and said third layer of metal are not interconnected by a via.

3. The semiconductor structure of claim 1 wherein the metal stacked inductor is spiral shaped.

4. The semiconductor structure of claim 2 wherein the metal stacked inductor is spiral shaped.

5. The semiconductor structure of claim 1 wherein said lower metal wire is embedded within an interconnect dielectric.

6. The semiconductor structure of claim 2 further comprising at least one wiring region that lies to the periphery of the metal stacked inductor, wherein in the at least one wiring region the second layer of metal serves as a via interconnecting two metal wires.

7. The semiconductor structure of claim 1 wherein the first layer of metal is comprised of a low resistivity conductive material having a resistivity of about 3.0 micro-ohm*cm or less.

8. The semiconductor structure of claim 7 wherein the low resistivity conductive material is selected from the group consisting of Cu, Al, Pt, Ag, Au, and alloys thereof.

9. The semiconductor structure of claim 7 wherein the low resistivity conductive material is Cu.

10. The semiconductor structure of claim 1 wherein the second layer of metal is comprised of a low resistivity conductive material having a resistivity of about 3 micro-ohm*cm or less, said second layer of metal comprising the same or different conductive material as the first layer of metal.

11. The semiconductor structure of claim 10 wherein the low resistivity conductive material is selected from the group consisting of Cu, Al, Pt, Ag, Au, and alloys thereof.

12. The semiconductor structure of claim 10 wherein the low resistivity conductive material is Al or Cu.

13. The semiconductor structure of claim 2 wherein the third layer of metal is comprised of a low resistivity conductive material having a resistivity of about 3 micro-ohm*cm or less, said third layer of metal comprising the same or different conductive material as the first or second layers of metal.

14. The semiconductor structure of claim 13 wherein the low resistivity conductive material is selected from the group consisting of Cu, Al, Pt, Ag, Au, and alloys thereof.

15. The semiconductor structure of claim 13 wherein the low resistivity conductive material is Al.

16. The semiconductor structure of claim 1 wherein the first layer of metal is comprised of Cu and the second layer of metal is comprised of Al.

17. The semiconductor structure of claim 2 wherein the first layer of metal is comprised of Cu, the second layer of metal is comprised of Cu and the third layer of metal is comprised of Al.

18. A method of forming a semiconductor structure comprising:

providing a partial interconnect structure comprising a lower metal wiring level located on a substrate;

forming a dielectric material on the partial interconnect structure;

forming a first layer of metal in said dielectric material, said first layer of metal serves as an upper metal wire of the interconnect structure and as the bottom layer of a metal stacked inductor, wherein said first layer of metal is in electrical contact with a lower metal wire by a via; and forming a second layer of metal on said first metal layer and above said dielectric material, wherein said first layer of metal and said second layer of metal are not interconnected by a via.

19. The method of claim 18 further comprising forming a third layer of metal directly on top of the second layer of metal, wherein said second layer of metal and said third layer of metal are not interconnected by a via.

* * * * *